United States Patent [19]

Kamiyama

[11] Patent Number: 5,486,488
[45] Date of Patent: Jan. 23, 1996

[54] PROCESS FOR MANUFACTURING SEMICONDUCTOR DEVICE

[75] Inventor: Satoshi Kamiyama, Tokyo, Japan

[73] Assignee: NEC Corporation, Japan

[21] Appl. No.: 347,712

[22] Filed: Dec. 1, 1994

[30] Foreign Application Priority Data

Dec. 2, 1993 [JP] Japan .................... 5-302473

[51] Int. Cl.$^6$ ............................... H01L 21/8242
[52] U.S. Cl. .................. 437/60; 437/47; 437/52; 437/919; 437/247; 148/DIG. 14
[58] Field of Search .................. 437/48, 52, 60, 437/919, 235, 247, 47; 148/DIG. 14

[56] References Cited

U.S. PATENT DOCUMENTS

| | | | |
|---|---|---|---|
| 5,234,857 | 8/1993 | Kim et al. | 437/60 |
| 5,248,629 | 9/1993 | Muroyama | 437/52 |
| 5,254,505 | 10/1993 | Kamiyama | 437/919 |
| 5,279,985 | 1/1994 | Kamiyama | 437/60 |
| 5,324,679 | 6/1994 | Kim et al. | 437/60 |
| 5,336,638 | 8/1994 | Suzuki et al. | 437/52 |
| 5,352,623 | 10/1994 | Kamiyama | 437/235 |

*Primary Examiner*—Tuan H. Nguyen
*Attorney, Agent, or Firm*—Hayes, Soloway, Hennessey, Grossman & Hage

[57] ABSTRACT

In a conventional method for forming a capacity element for DRAM, a tantalum oxide film is formed on the surface of polycrystal silicon film constituting a capacity lower electrode, and a high temperature treatment is then carried out in an oxygen atmosphere to improve leakage current properties, thereby converting this tantalum oxide film. In the capacity element having the thus formed capacity insulating film, an obtainable capacity value is small. In the present invention, a densification treatment is carried out at a relatively low temperature in place of the high temperature treatment step of the tantalum oxide film, whereby the capacity element having the large capacity value can be formed without deteriorating the leakage current properties.

7 Claims, 10 Drawing Sheets

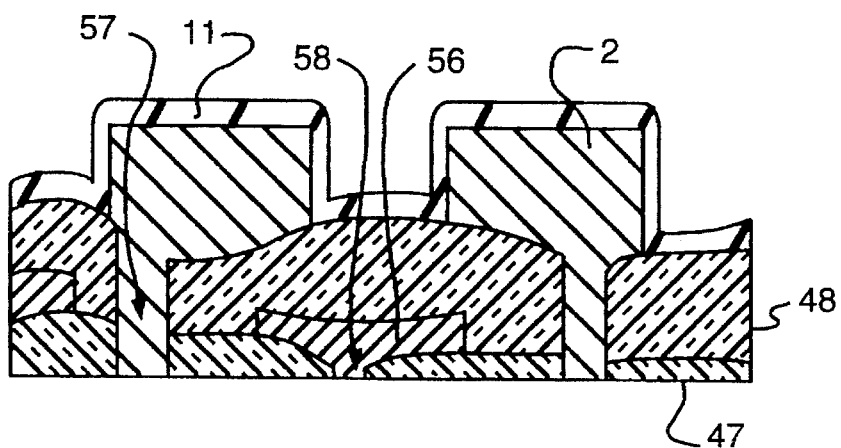
FIG. 10 (a) (PRIOR ART)
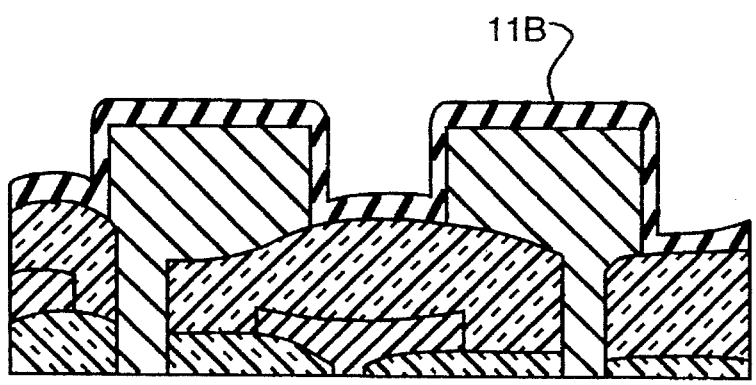
FIG. 10 (b) (PRIOR ART)
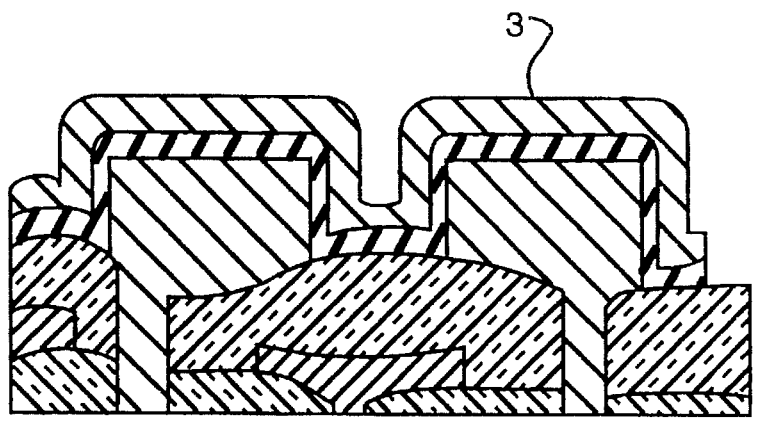
FIG. 10 (c) (PRIOR ART)

PROCESS FOR MANUFACTURING SEMICONDUCTOR DEVICE

BACKGROUND OF THE INVENTION

1. Field of the Invention

The present invention relates to a process for manufacturing a semiconductor device, and more specifically, it relates to a process for manufacturing a capacity element of DRAM in which a tantalum oxide film is used as a capacity insulating film.

2. Description of the Prior Art

With regard to capacity elements of very large scale integrated circuit (VLSI) memory devices, since the development of 256M bit DRAM, the employment of capacity insulating films having a high dielectric constant which can increase a capacity value per unit area has been investigated. Among such capacity insulating films, a tantalum oxide film obtained by chemical vapor deposition (CVD) has a high dielectric constant $\epsilon_r$ of 25 to 30, which means that the tantalum oxide film possesses excellent step coverage properties. In addition, the formation of the tantalum oxide film is much easier as compared with other insulating films having a high dielectric constant. For these reasons, the tantalum oxide film has been positively researched.

An example of such a memory devices is illustrated in FIG. 1 which is taken from my prior U.S. Pat. No. 5,352,623. This FIG. 1 corresponds to FIG. 2 of the '623 patent and shows a pair of memory cells, for simplicity, each constituted by a transistor 50 having active regions in the first P-well 43A, although a large number of memory cells are formed within the first P-well 43A. The pair of memory cells comprise n-type regions 51 and 51A as source and drain regions of the pair of transistors 50 and gate electrodes 55 composed of polysilicon 53 and silicide 54. The pair of transistors 50 are covered by a first interlayer insulating film 47 through which a contact hole 58 filled with a contact connecting a bit line 56 with the n-type region 51. i.e., one of the source and drain regions of and common to the pair of transistors 50. A second interlayer insulating film 48 is formed to cover the bit line 56, following which a pair of stacked capacitor elements surrounded in the drawing by a dotted line 70 are formed on the second interlayer insulating film 48.

Each of the stacked capacitor elements comprises a lower capacitor electrode 2 made of poysilicon, a tantalum oxide film 11 as a dielectric film of the capacitor element and an upper capacitor electrode 3. The lower capacitor electrodes 2 are connected to the respective n-type regions 51A, i.e. the other off the source and drain regions of the transistors 50, via respective contact holes 57 formed in the first and second interlayer insulating films 47 and 48. The upper capacitor electrode 3 is common to the capacitor elements of the pair of memory cells, extending on the tantalum oxide film 11 and the second interlayer insulating film 48.

The upper capacitor electrode 3 is electrically connected via a through-hole 67 to an aluminum electrode 71A maintained at a fixed potential, such as a ground potential, and formed on a third interlayer insulating film 49. The aluminum electrode 71A comprises an aluminum layer and a titanium nitride film 72 underlying the aluminum layer. The through-hole 67 is filled with a tungsten plug 73 and a titanium nitride film 72 covering the tungsten plug 73.

A transistor 60 forming a peripheral circuit of the memory device is shown as having n-type regions 51B in the second P-well 43B, a gate insulating film 52 formed on the P-well 43B, and a gate electrode 55 composed of a polysilicon film 53 and an silicide film 54 and formed on the gate insulating film 52. Aluminum electrode 71B for the transistor 60 is connected to one of the source and drain regions 51B via a contact hole 68 formed through the first, second and third insulating films 47, 48 and 49 and filled with a tungsten plug 73 and a titanium nitride film 72 formed thereon. Another gate electrode 55 of a transistor of the peripheral circuit not shown in the drawing is connected to the aluminum electrode 71C.

FIG. 10 is a sectional view of a process for manufacturing a capacity element for a cell of DRAM, and with reference to FIG. 10, reference will be made to a conventional method for manufacturing a stack type capacity element for DRAM in which the tantalum oxide film is used as the capacity insulating film.

First, a transistor is formed on the surface of a P-type silicon substrate, and this transistor is then covered with an interlayer insulating film 47. Next, a contact hole 58 is formed through the interlayer insulating film 47 so as to reach one of the N-type source drain regions of the transistor. A bit line 56 connected to this N-type sourcedrain region via the contact hole 58 is formed on the surface of the interlayer insulating film 47. Then, an interlayer insulating film 48 is formed so as to cover the surface of the interlayer insulating film 47 inclusive of the bit line 56.

On such a structure, a contact hole 57 is formed so as to reach the other N-type source-drain regions of the transistor through the interlayer insulating films 48, 47. Then, a polycrystal silicon film doped with phosphorus is formed all over the structure, and this polycrystal silicon film is patterned to obtain a capacity lower electrode 2. Next, a tantalum oxide film 11 is formed on the surface of the interlayer insulating film 48 inclusive of the capacity lower electrode 2 by vacuum vapor deposition using a pentaethoxytantalum [Ta(OC$_2$H$_5$)$_5$] gas as an organic material and oxygen [FIG. 10 (a)]. Afterward, in order to improve the leakage current properties of this tantalum oxide film 11, high temperature heat treatment is carried out in an oxygen atmosphere, whereby the tantalum oxide film 11 becomes a tantalum oxide film 11B [FIG. 10 (b)]. The temperature in this heat treatment is usually in the range of 700° to 900° C. In succession, a capacity upper electrode 3 is formed [FIG. 10 (c)]. As this upper electrode 3, a tungsten film or the like is used.

SUMMARY OF THE INVENTION

1. Object of the Invention

The above conventional capacity element has the following drawbacks. In a conventional capacity element formation step, the tantalum oxide film 11 is formed on the surface of the polycrystal silicon film constituting the capacity lower electrode 2, and for the purpose of improving the leakage current properties, the high temperature heat treatment is carried out in an oxygen atmosphere to convert the tantalum oxide film 11 into the tantalum oxide film 11B. In the capacity element having the thus formed capacity insulating film, a capacity value of merely about 3 nm ($C_s$=11.5 fF/μm$^2$) in terms of the film thickness of a silicon oxide film (the dielectric constant $\epsilon_r$=3.9) is obtained. This is attributable to the fact that a silicon oxide film having a thickness of about 2 nm is formed between the tantalum oxide film 11B and the capacity lower electrode 2 by the high temperature heat treatment in the oxygen atmosphere. Even in the capacity element in which the tantalum oxide film 11 immediately after deposition has been carried out without involving the high temperature heat treatment in the oxygen atmosphere (as-deposited) is used, a capacity value of merely about 2.5 nm ($C_s$=14 fF/$\mu m^2$) in terms of the film thickness of the silicon oxide film is obtained. This is attributable to the fact that a native oxide film having a thickness of about 1 nm or more is originally formed on the surface of the capacity lower electrode 2. If this capacity insulating film, which is a laminate of the silicon oxide film having a thickness of about 2 nm and the tantalum oxide film 11B, is applied to a capacity element such as a 256M bit DRAM, a sufficient capacity value cannot be obtained.

If much attention is paid to the native oxide film formed on the surface of the capacity lower electrode 2 and another native oxide film which will be further formed thereon, a method can be contrived in which the native oxide film on the surface of the capacity lower electrode 2 is removed therefrom and the surface then covered with a metal film. However, since the high temperature heat treatment in the oxygen atmosphere for improving the leakage current properties (the conversion of the tantalum oxide film 11 into the tantalum oxide film 11B) is done at a high temperature, the surface of this metal film is also directly exposed to the oxygen atmosphere, so that a metal oxide film is formed on the surface of the metal film. In consequence, the virtual decrease in the thickness of the metal film calculated in terms of the film thickness of the silicon oxide film cannot be easily realized. In addition, there is another problem that this metal is liable to peel owing to a difference between thermal expansion coefficients at the time of this high temperature heat treatment.

The present invention seeks to develop a treatment which can be given to a tantalum oxide film for improving the leakage current properties, which treatment can be carried out at a relatively low temperature. Thus, an object of the present invention is to provide a process for manufacturing a semiconductor device in which a capacity element having good leakage current properties and a large capacity value can be formed.

2. Disclosure of the Invention

A process of manufacturing a semiconductor device of the present invention has a step of forming a capacity lower electrode having, on its surface, a first conductive film, a step of forming a capacity insulating film comprising a tantalum oxide film, a step of subjecting the tantalum oxide film to a densification treatment, and a step of forming a capacity upper electrode comprising a second conductive film.

Preferably, the first conductive film is film of tungsten, molybdenum or titanium; film of nitride or silicide of tungsten, molybdenum or titanium; or laminated structure of the above films; a technique for forming the tantalum oxide film is a chemical vapor deposition method using an organic tantalum material; the densification treatment of the tantalum oxide film is a plasma treatment using an oxidizing gas; and the second conductive film is film of tungsten, molybdenum or titanium; film of nitride or silicide of tungsten, molybdenum or titanium; or laminated structure of two or more the above films.

A second process for manufacturing a semiconductor device of the present invention has a step of forming a silicon film pattern having its surface covered with hemispherical crystalline particles, a step of forming, on the surface of the silicon film pattern, a first conductive film to form a capacity lower electrode, a step of forming a capacity insulating film comprising a tantalum oxide film, a step of subjecting the tantalum oxide film to a densification treatment, and a step of forming a capacity upper electrode comprising a second conductive film.

BRIEF DESCRIPTION OF THE DRAWINGS

FIG. 10(a)–10(b) are a schematic sectional view illustrating a conventional manufacturing process for a semiconductor device.

DETAILED DESCRIPTION OF THE INVENTION

Embodiments of the Invention:

Prior to the description of examples of the present invention, a semiconductor device to which the examples of the present invention can be applied will be described.

Figure 1:
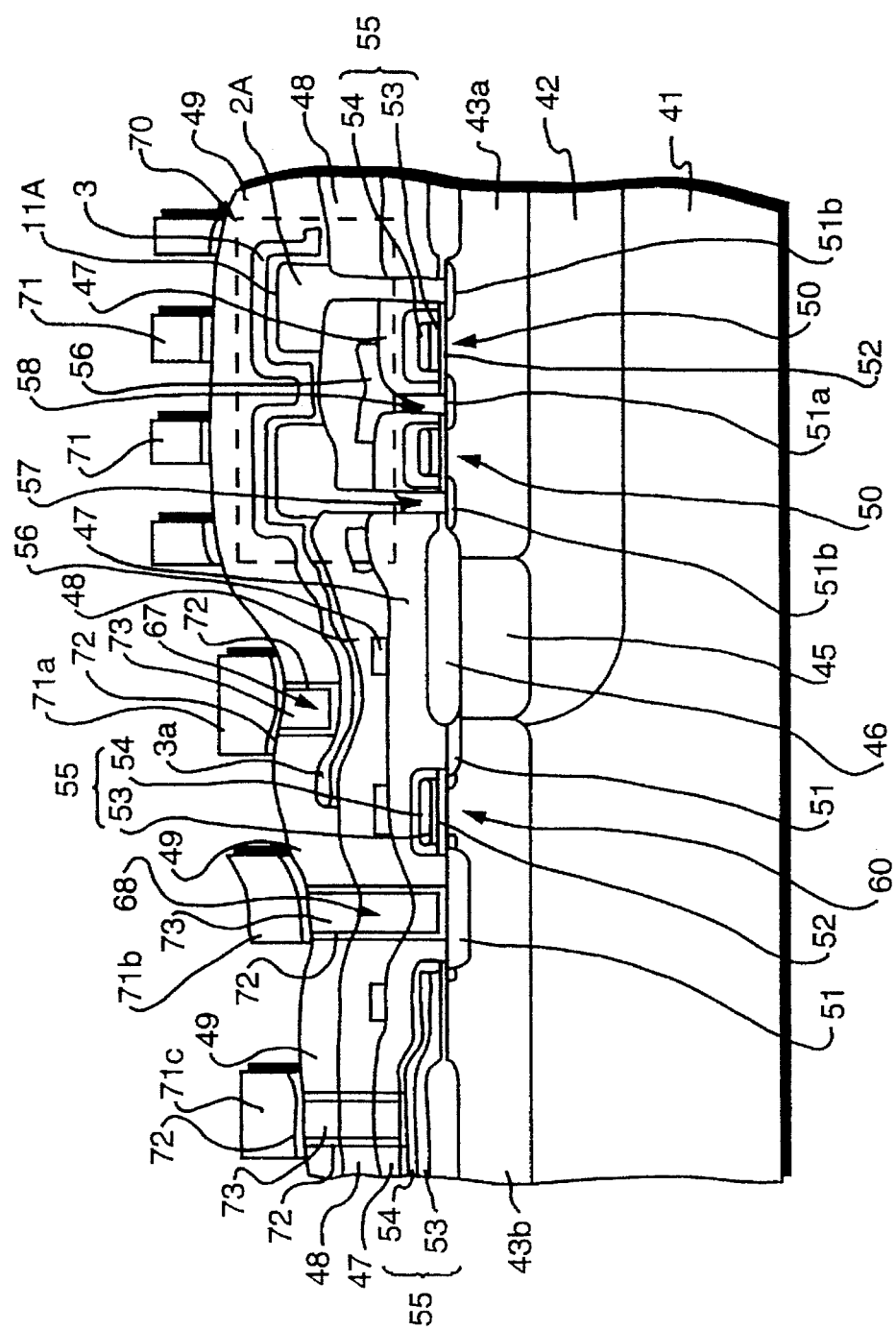
FIG. 1 is a schematic sectional view illustrating an element structure of DRAM to which the present invention is applied.

As shown in FIG. 1, which is a schematic sectional view of a semiconductor device, the structure of DRAM to which examples of the present invention can be applied is as follows.

On the surface of a P-type silicon substrate 41, an N well 42 is formed, and on the surface of this N well 42, a first P well 43a is formed. Further, on the surface of the periphery of the N well 42, an N type separation region 45 is formed, and on the surface of the P-type silicon substrate 41 except the N well 42, a second P well 43b is formed. The P well 43a and the P well 43b are element-.separated from each other by the N type separation region 45 and a field oxide film 46 formed on this surface.

On active regions element-separated by the field oxide film 46 on the surface of the first P well 43a, transistors 50 constituting memory cells are formed. In FIG. 1, one pair of memory cells alone is shown. Each transistor 50 is composed of N-type source-drain regions 51a, 51b formed on the surface of the P well 43a, a gate insulating film 52 formed on the surface of the P well 43a, and a gate electrode 55 comprising the laminate of a polycrystal silicon film 53 and a silicide film 54 formed on the surface of the P well 43a via the gate insulating film 52. These transistors 50 are covered with a first interlayer insulating film 47. A contact hole 58 which reaches the (one) source-drain region 51a is provided through this interlayer insulating film 47, and this contact hole 58 is shared by the pair of transistors 50. A bit line 56 provided on the surface of the interlayer insulating film 47 is connected to the sourcedrain region 51a via this contact hole 58.

This bit line 56 is covered with the second interlayer insulating film 48. On this interlayer insulating film 48, the capacity element portion 70 (a portion surrounded by a dotted line) is provided. That is to say, the stack type capacity element according to the present invention is composed of a capacity lower electrode 2A, a tantalum oxide film 11A as a capacity insulating film and a capacity upper electrode 3. The pair of capacity lower electrodes 2A are connected to each sourcedrain region 51b via the contact hole 57 which reaches the (other) N-type source-drain region 51b of each of the pair of transistors 50 through the interlayer insulating films 48, 47. Moreover, the capacity upper electrode 3 is continuously formed in common with each capacity element of the pair of memory cells. This capacity upper electrode 3 is spread on the surface of the second interlayer insulating film 48, and it is provided with a capacity upper electrode a which is a fetch portion for connecting to an upper wire.

The capacity element portion 70 is covered with a third interlayer insulating film 49. An aluminum electrode 71a which is one of a plurality of aluminum electrodes 71 arranged on the surface of the interlayer insulating film 49 is connected to the capacity upper electrode 3a via a contact hole 67 provided in the interlayer insulating film 49. This aluminum electrode 71a has such a fixed potential as an earth potential. The side and the bottom of the contact hole 67 are covered with a titanium nitride film 72, and the contact hole 67 is filled with a tungsten film 73. Furthermore, the bottoms of the aluminum electrodes 71 are also covered with the titanium nitride film 72.

On the other hand, a transistor 60 constituting a peripheral circuit of a memory device is composed of the N-type source-drain region 51 provided on the surface of the P well 43b, the gate insulating film 52 formed on the surface of the P well 43b, and the gate electrode 55 comprising the laminate of the polycrystal silicon film 53 and the silicide film 54 formed on the surface of the P well 43b via the gate insulating film 52. An aluminum electrode 71b is connected to one of the source-drain regions 51 via a contact hole 68 provided through the interlayer insulating films 49, 48, 47. The side and the bottom of this contact hole 68 are also covered with the titanium nitride film 72, as in the case of the contact hole 67, and the contact hole 68 is also filled with the tungsten film 73. Similarly, the gate electrode 55 of the other transistor 60 in the peripheral circuit is connected to an aluminum electrode 71c via a contact hole.

Now, the present invention will be described in detail with reference to examples. However, the scope of the present invention should not be limited to these examples.

EXAMPLE 1

This example will be described with reference to FIG. 2 which is a sectional view illustrating a manufacturing process for a semiconductor device and is a partially enlarged sectional view of a capacity element portion 70 in FIG. 1, and FIG. 3 which is a schematic sectional view illustrating a chemical vapor deposition device.

First, a second interlayer insulating film 48 is formed on an interlayer insulating film 47, and a contact hole 57 is then formed through the interlayer insulating films 48, 47. Afterward, a polycrystal silicon film is deposited thereon by a chemical vapor deposition (CVD) method, and after this polycrystal silicon film is doped with phosphorus, patterning is carried out to form a polycrystal silicon film 102 [FIG. 2 (a)]. In this case, a material with which the contact hole 57 is filled may be the polycrystal silicon film doped with phosphorus which has been formed for the formation of the polycrystal silicon film 102, but a beforehand separately formed N-type polycrystal silicon film, a tungsten film and the like are also acceptable.

Figure 2:
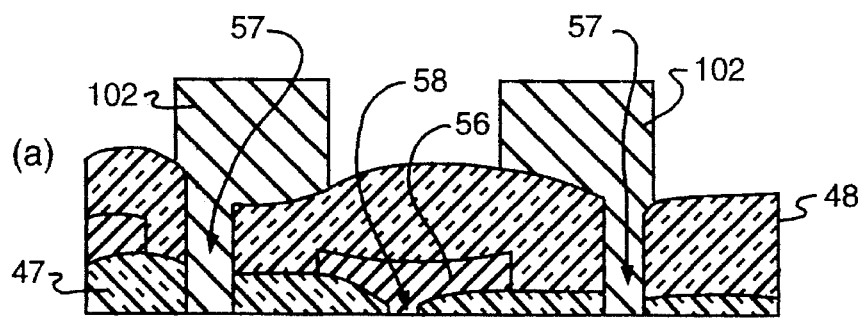
FIGS. 2(a)–2(b) are a sectional view illustrating a manufacturing process of Example 1, and a partially enlarged sectional view of part of a capacity element portion 70 in FIG. 1.
Figure 2:
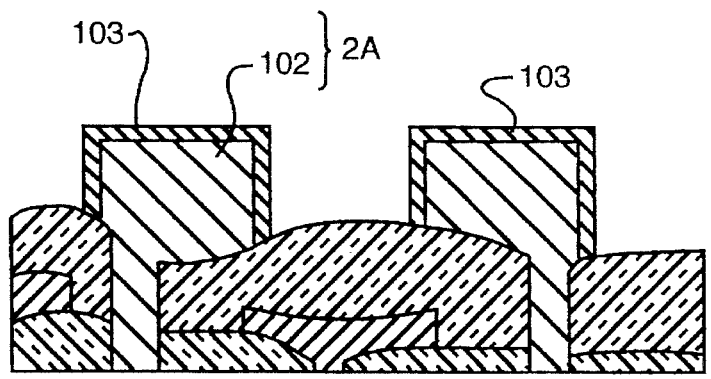
Figure 2:
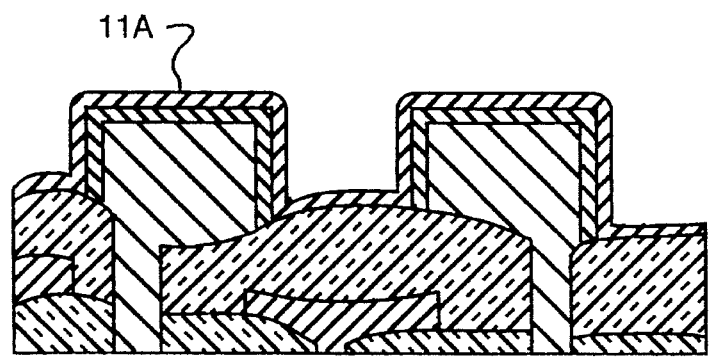
Figure 2:
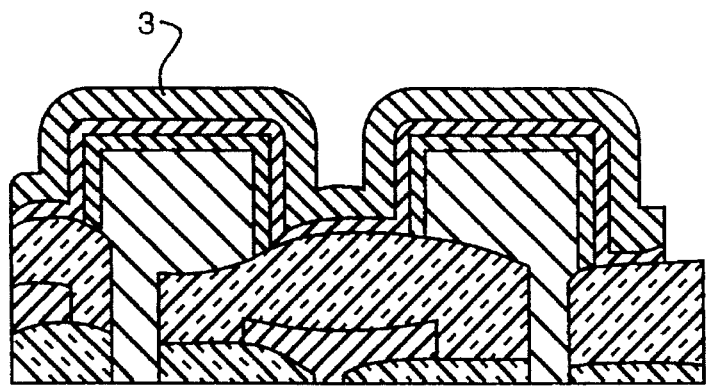

Next, a native oxide film on the surface of this polycrystal silicon film 102 is removed with diluted hydrofluoric acid, and a tungsten metal film 103 is then formed on the surface of the polycrystal silicon film 102 to form a capacity lower electrode 2A comprising the polycrystal silicon film 102 and the tungsten metal film 103 [FIG. 2 (b)]. The tungsten metal film 103 contains at least one of a tungsten film, a tungsten silicide film and a tungsten nitride film. In this connection, instead of the tungsten metal film 103, a molybdenum metal film containing at least one of a molybdenum film, a molybdenum silicide film and a molybdenum nitride film; or a titanium metal film containing at least one of a titanium film, a titanium silicide film and a titanium nitride film; or a laminated structure of two or more of the above films is also acceptable.

Next, a tantalum oxide film (not shown) is deposited on the surface of the interlayer insulating film 48 inclusive of the surface of the capacity lower electrode 2A by the CVD method.

Figure 3:
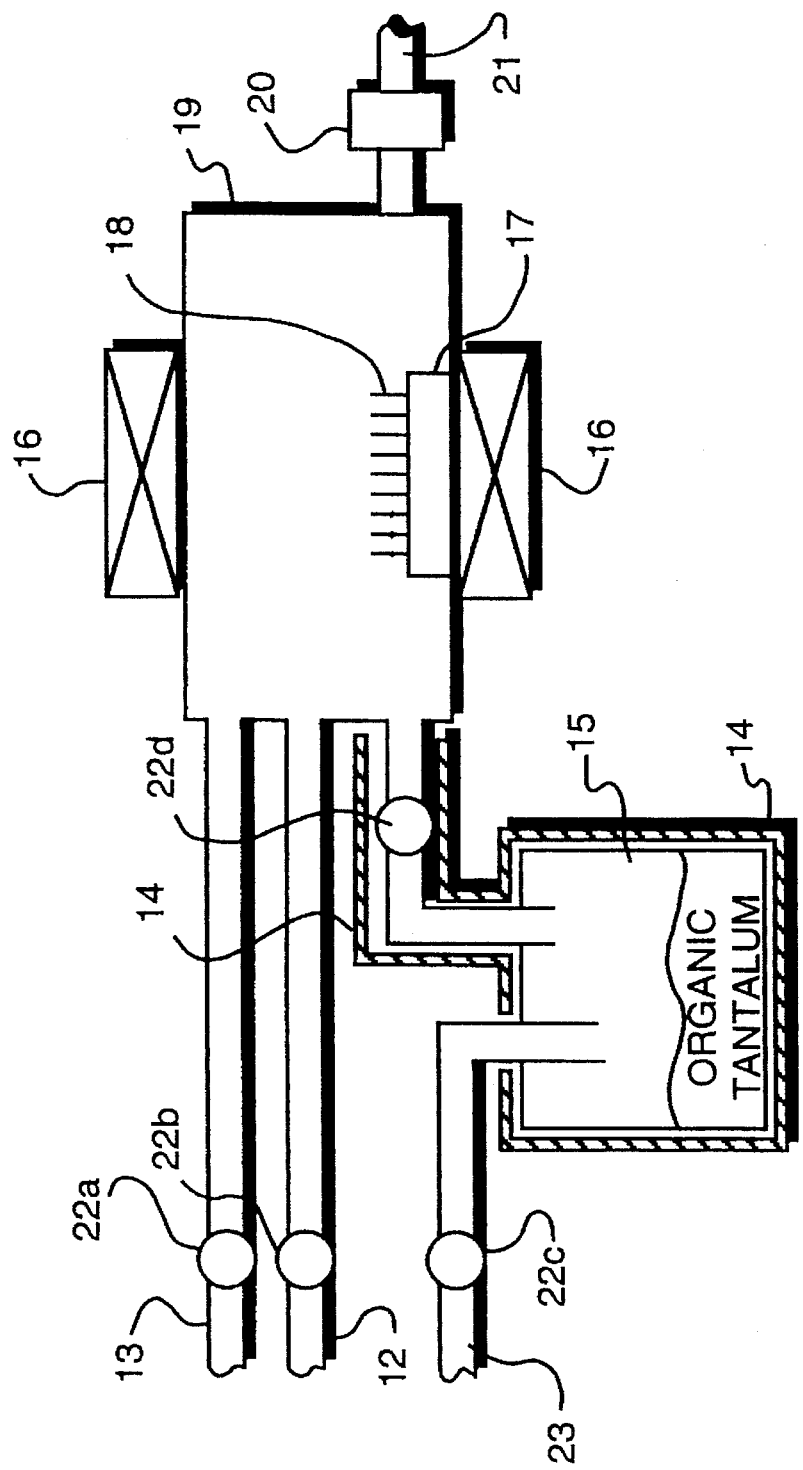
FIG. 3 is a schematic sectional view illustrating a CVD device used in Example 1.

For the formation of this tantalum oxide film, a low pressure chemical vapor deposition device (LPCVD) shown in FIG. 3 is used. As material gases, a pentaethoxytantalum [$Ta(OC_2H_5)_5$] gas and oxygen are used. The pentaethoxytantalum gas is prepared by vaporizing pentaethoxytantalum in a vaporization chamber 15 by a heater 14, and this gas is then led to a reaction furnace 19 via a valve 22d with the aid of an argon gas which is a carrier gas forwarded via a valve 22c through a conduit 23. In this reaction furnace 19, a substrate holder 17 on which semiconductor wafers 18 are mounted is placed. Simultaneously, an oxygen gas is introduced into the reaction furnace 19 via a valve 22b through a conduit 12. The reaction chamber 19 is heated by a heater 16, so that a chemical gaseous reaction Occurs between the introduced organic tantalum gas and oxygen gas, with the result that a tantalum oxide film is deposited on the surface of the semiconductor wafers 18. As suitable deposition conditions, the heating temperature in the vaporization chamber 15 is in the range of 30° to 200° C.; the flow rate of the argon gas as the carrier gas is in the range of 10 to 1,000 sccm; the flow rate of the oxygen gas is in the range of 100 to 20,000 sccm; and the pressure in the vaporization chamber 15 is in the range of $1.3 \times 10^2$ to $1.3 \times 10^4$ Pa. In addition to the above conduits 12, 23, an argon gas conduit 13 is connected to this reaction chamber 19, and the argon gas is introduced thereinto via a valve 22a. Furthermore, a vacuum pump 20 having an exhaust vent 21 is connected to this reaction chamber.

After the deposition of the above tantalum oxide film, this tantalum oxide film is subjected to a densification treatment to form a tantalum oxide film 11A [FIG. 2 (c)]. This treatment is a plasma treatment using an oxidizing gas, and examples of the usable oxidizing gas include an oxygen gas, an oxygen gas containing water and a nitrous oxide ($N_2O$) gas. The temperature for this treatment is preferably in the range of room temperature to 300° C. In the case of the oxygen gas containing water, the amount of water to be added is preferably in the range of 1 to 1,000 ppm.

In succession, a titanium nitride film (not shown) is deposited all over the tantalum oxide film as a second conductive film, and this titanium nitride film and the tantalum oxide film 11A are then patterned. Further, a nitriding treatment is carried out to form a capacity upper electrode 3 comprising the titanium nitride film [FIG. 2 (d)]. This nitriding treatment is a plasma treatment using an ammonia gas. As suitable conditions of the nitriding treatment, temperature is in the range of room temperature to 600° C.; pressure is in the range of $1.3 \times 10^2$ to $1.3 \times 10^4$ Pa; and power is in the range of 50 to 500 W. A nitrogen gas or a nitrous oxide ($N_2O$) gas may be used in addition to the ammonia gas.

In this example, the titanium nitride film is used as the capacity upper electrode 3 (second conductive film), but it is not restrictive in the present invention. Other examples of the usable film as the capacity upper electrode 3 include a tungsten film, a molybdenum film, a titanium film; a tungsten nitride film, a molybdenum nitride film; a tungsten silicide film, a molybdenum silicide film, a titanium silicide film; or a laminated structure of two or more of the above films.

Afterward, the deposition and reflow of a third interlayer insulating film 49, the formation of contact holes 67, 68, the formation of a contact phosphorus diffusing layer, and the formation of aluminum electrodes 71, 71a, 71b, 71c (see FIG. 1) are carried out to complete DRAM. As a high temperature heat treatment after the formation of the capacity element portion 70, there is the reflow of the interlayer insulating film 49 or an activation treatment for forming the contact phosphorus diffusing layer on the bottom of the contact hole 68, and this high temperature heat treatment is carried out at a temperature of about 700° to 850° C.

Here, the surface of the tungsten metal film 103 constituting the capacity lower electrode 2A is covered with the densified tantalum oxide film 11A (the capacity upper electrode 3, the interlayer insulating film 49 and the like), and hence, during the high temperature heat treatment, any formation of a metal oxide film or the like on the surface of the tungsten metal film 103 is prevented. In addition, the tungsten metal film 103 can also be prevented from peeling.

Figure 4:
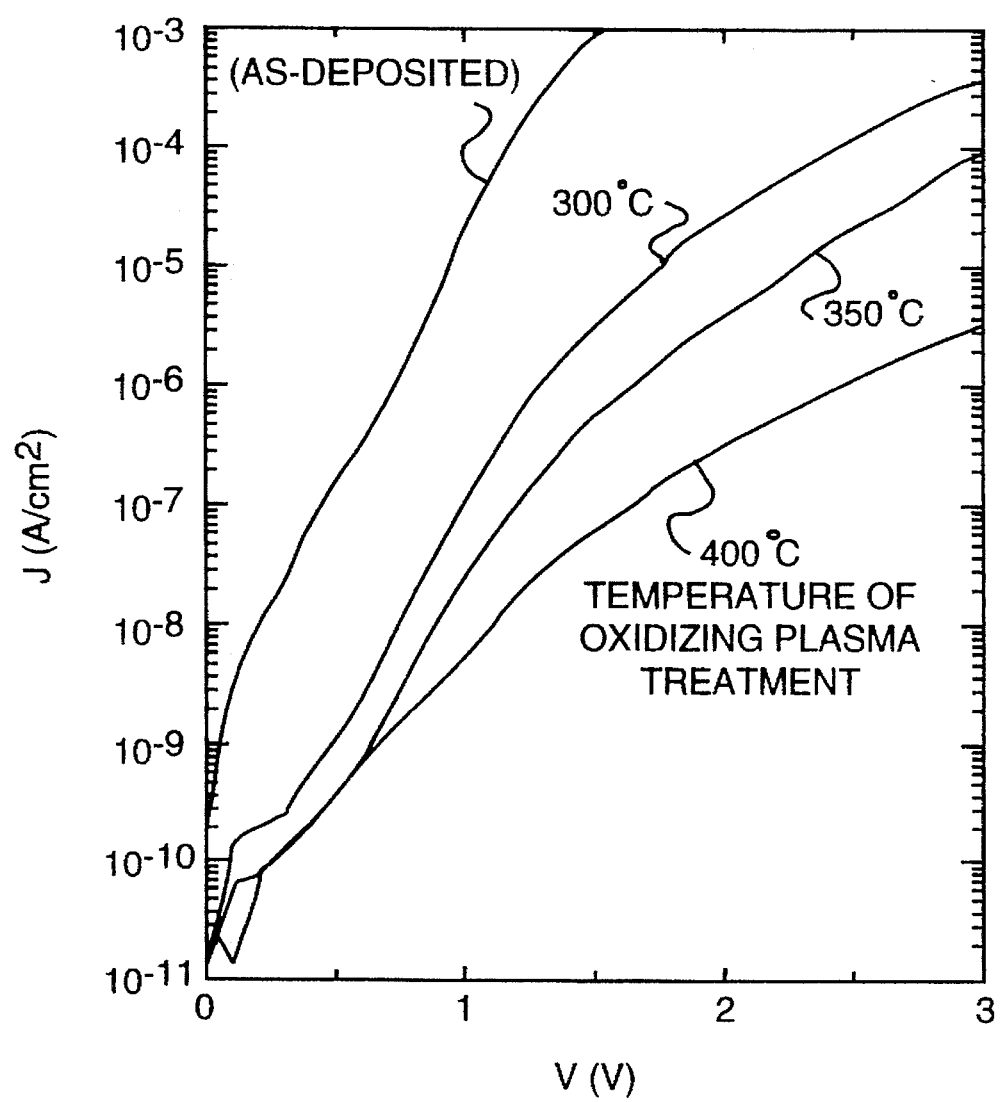
FIG. 4 is a view for explaining an effect of Example 1, and a graph showing leakage current properties of a capacity element.

As understood from a graph in FIG. 4 showing leakage current properties, the capacity element in this example allows a leakage current density J to noticeably decrease with the rise of the temperature of the oxidizing plasma treatment. This can be considered to be attributable to the fact that water and carbon contained in the tantalum oxide film immediately after the film formation diffuse outwardly with the rise of the treatment temperature, and oxygen vacancies in the tantalum oxide film are filled up by ion bombardment in the oxygen plasma treatment to densify this film (to become the tantalum oxide film 11A).

Figure 5:
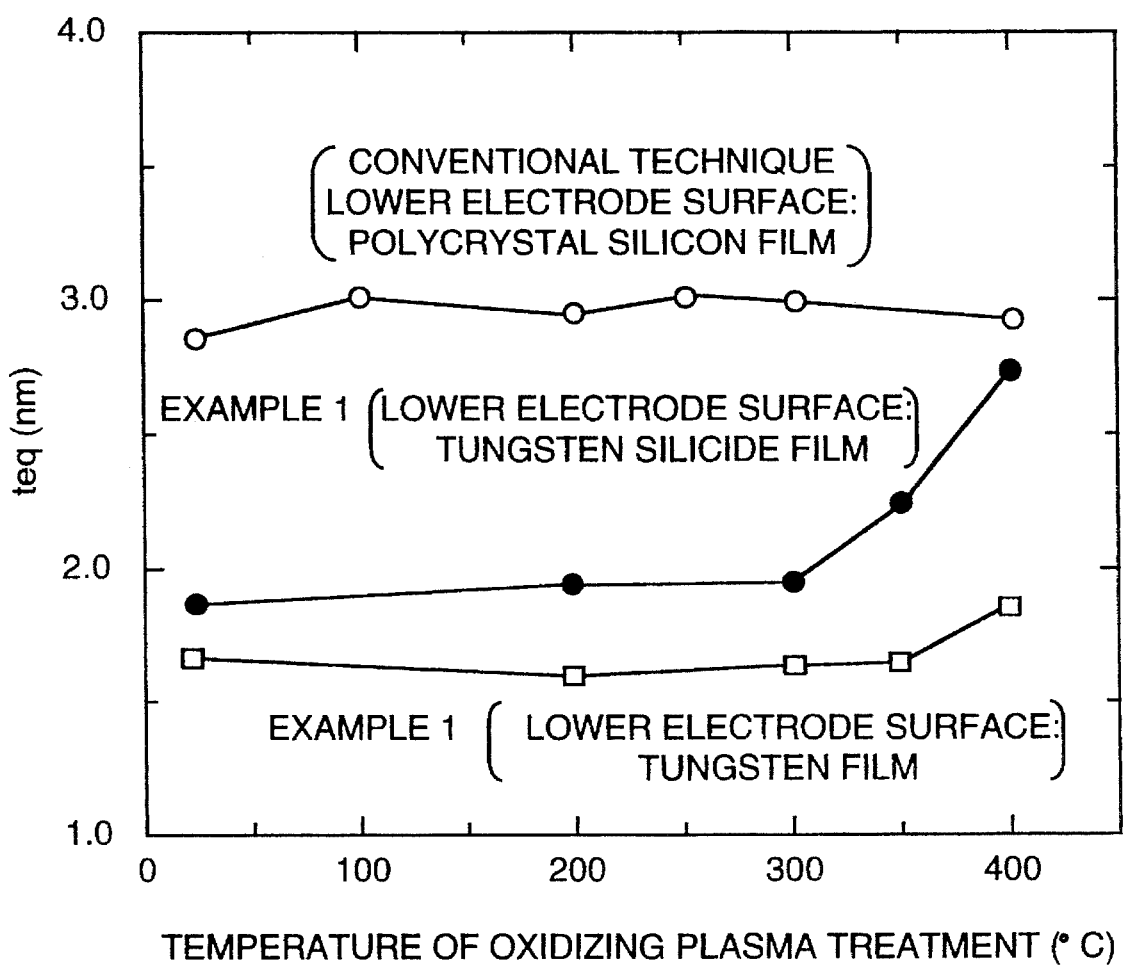
FIG. 5 is a view for explaining the effect of Example 1, and a graph showing the film thickness of a capacity insulating film for a capacity element calculated in terms of a silicon oxide film.

As is apparent from the graph in FIG. 5 showing the oxidizing plasma treatment temperature dependency of a film thickness $t_{eq}$ in terms of a silicon oxide film, the film thickness $t_{eq}$ of the capacity insulating film of the capacity element in this example in terms of the silicon oxide film is about 1.6 nm in the case that the tungsten metal film 103 comprises the tungsten film, and it is nearly equal to 2 nm in the case that the tungsten metal film 103 comprises the tungsten silicide film. On the contrary, in the case that the capacity lower electrode comprises the polycrystal silicon film only, as in a conventional technique, $t_{eq} \approx 3$ nm. This makes it apparent that the film thickness of the capacity insulating film can virtually be reduced by the employment of this example. The reason why the reduction degree of the film thickness is lower in the case that the tungsten metal film 103 comprises the tungsten silicide film is that silicon in the silicide is oxidized. In any case, oxidation on the surface of the tungsten metal film 103 is noticeable, when the temperature of the oxidizing plasma treatment is in excess of 300° C.

EXAMPLE 2

A second example of the present invention will be described with reference to FIG. 6 which is a sectional view illustrating a manufacturing process for a semiconductor device and is a partially enlarged sectional view of a portion corresponding to the capacity element portion 70 in FIG. 1.

First, as in Example 1, a second interlayer insulating film 48 is formed on an interlayer insulating film 47, and a contact hole 57 passing through the interlayer insulating films 48, 47 is then formed. Afterward, an amorphous silicon film doped with phosphorus is deposited thereon by a CVD method, and this amorphous silicon film is then patterned to form an amorphous silicon film 112 [FIG. 6 (a)]. In this case, a material with which the contact hole 57 is filled may be the amorphous silicon film doped with phosphorus which has been formed for the formation of the amorphous silicon film 112, but a N-type polycrystal silicon film separately formed beforehand, a tungsten film and the like are also acceptable.

Next, a native oxide film on the surface of this amorphous silicon film 112 is removed with diluted hydrofluoric acid, and the surface of the amorphous silicon film 112 is then converted into a coarse silicon surface [a surface having hemispherical silicon grains (HSG)] by molecular beam irradiation using a disilane ($Si_2H_6$) gas, thereby forming an amorphous silicon film 112a. In succession, on the surface of the amorphous silicon film 112a, a film comprising the laminate of a titanium nitride film and a tungsten film is formed, followed by patterning, to form a conductive film 113. A capacity lower electrode 2B in this example is composed of the amorphous silicon film 112a and the conductive film 113 [FIG. 6 (b)]. The thickness of the conductive film 113 is preferably 100 nm or less. The reason for this is that the particle diameter of HSG is usually controlled in the range of 20 to 200 nm, and thus if the thickness of the conductive film is more than 100 nm, the coarse state cannot be maintained, so that the effect of the increased surface area decreases.

In this example, as the conductive film 113, the laminate of the titanium nitride film and the tungsten film is used, but this is not restrictive in the present invention. Other examples of the usable conductive film 113 include the tungsten film, a molybdenum film, a titanium film; a tungsten nitride film, a molybdenum nitride film, the titanium nitride film; a tungsten silicide film, a molybdenum silicide film, a titanium silicide film; or a laminate structure of two or more of the above films.

Figure 6:
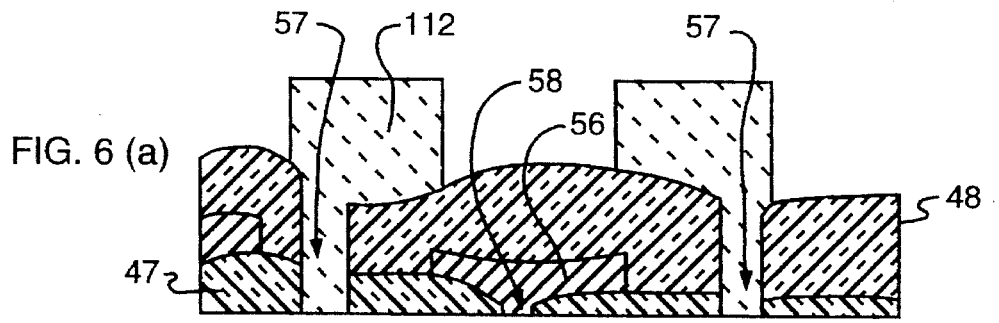
FIGS. 6(a)–6(d) are a sectional view illustrating a manufacturing process of Example 2 of the present invention, and a partially enlarged sectional view of a portion corresponding to the capacity element portion 70 in FIG. 1.
Figure 6:
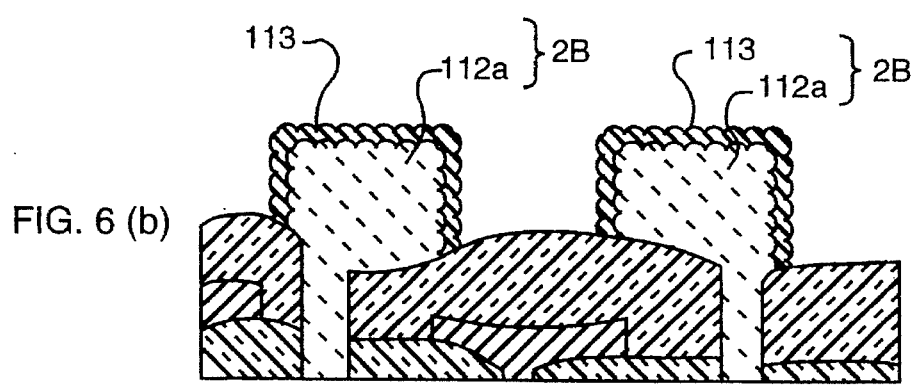
Figure 6:
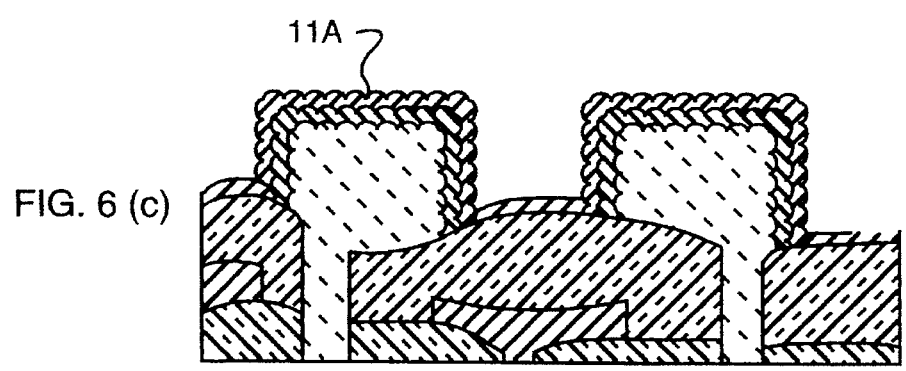
Figure 6:
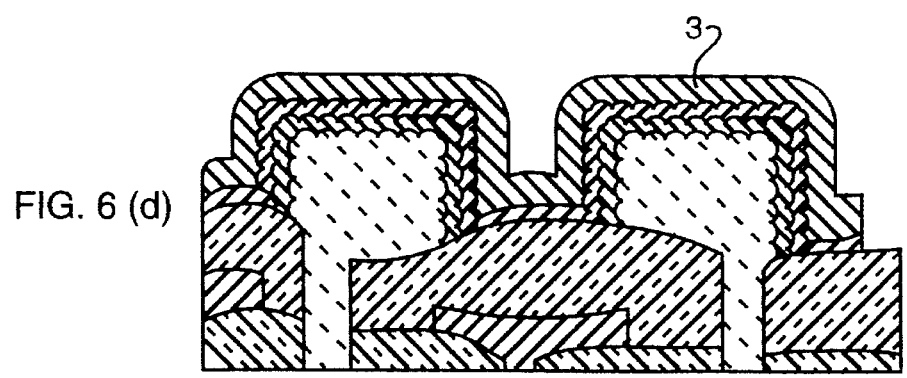

Next, as in Example 1, a densified tantalum oxide film 11A is formed [FIG. 6 (c)], and a capacity upper electrode 3 is then formed [FIG. 6 (d)]. The subsequent steps are also the same as in Example 1.

Figure 7:
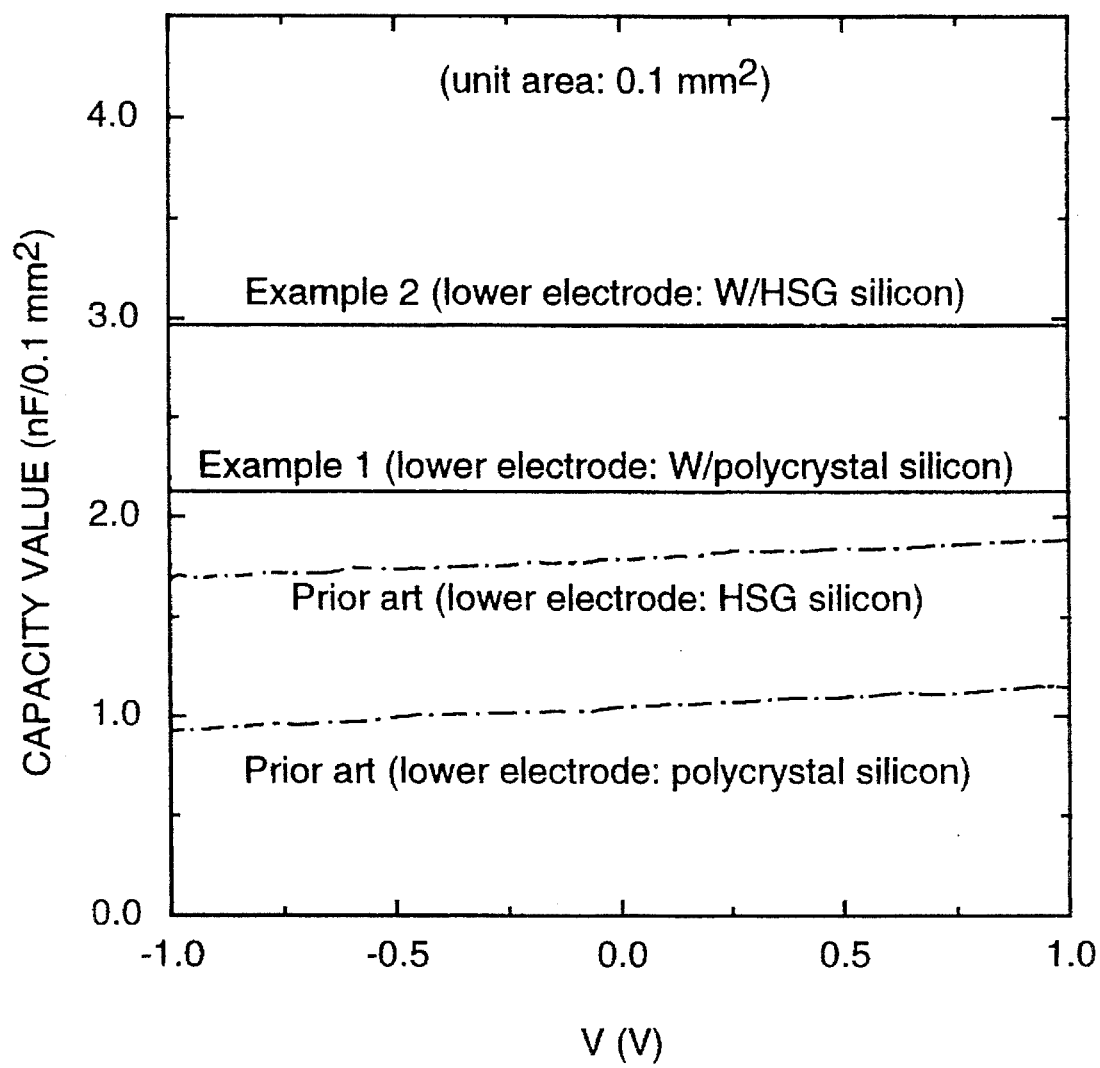
FIG. 7 is a view for explaining an effect of Example 2, and a graph showing a capacity value of the capacity element.

FIG. 7 is a graph showing a capacity value per unit area. The capacity value of this example is 1.6 times, 2.6 times and 1.8 times that of the above Example b 1, that of a conventional capacity element having a capacity lower electrode comprising a polycrystal silicon film alone, and that of a conventional capacity element having a capacity lower electrode comprising an amorphous silicon film having an HSG structure, respectively. The reason for this is that the employment of the HSG in this example permits increasing the virtual surface area of the capacity lower electrode 2B.

Figure 8:
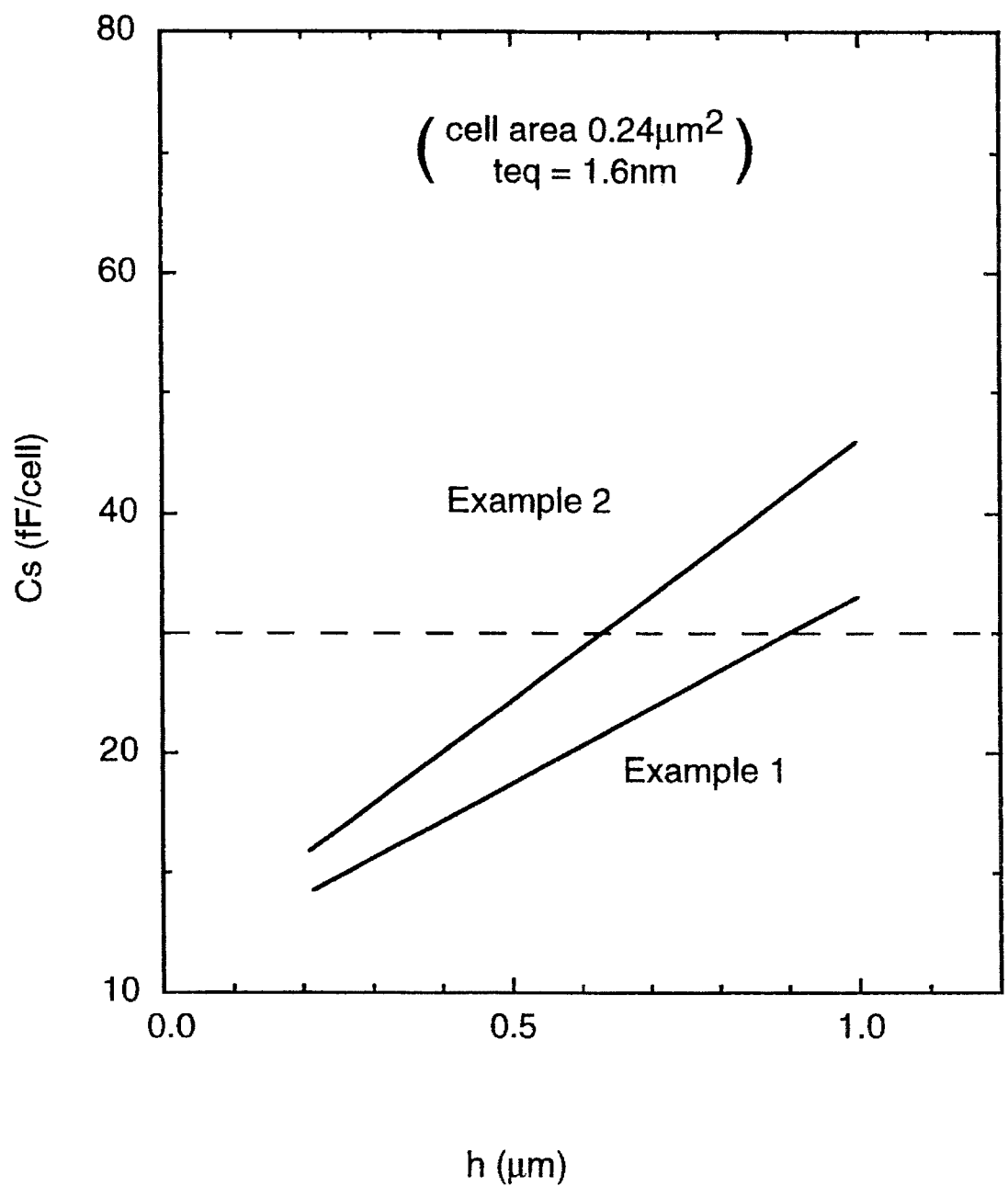
FIG. 8 is a view for explaining an effect of Example 2, and a graph showing a change of the capacity value per cell to the height of a stack type capacity element.

Referring to FIG. 8 which is a graph showing a change of the capacity value per cell to the height h of a stack type capacity element, the obtained capacity value of this example is about 1.4 times as much as that of Example 1 in the case that a cell area per cell is 0.24 µm² (which corresponds to a cell area of 1 G bit DRAM) and $t_{eq}$ is 1.6 nm. For example, in this example, the capacity value $C_s$ per unit area is 30 fF, when h is 0.6 µm.

Figure 9:
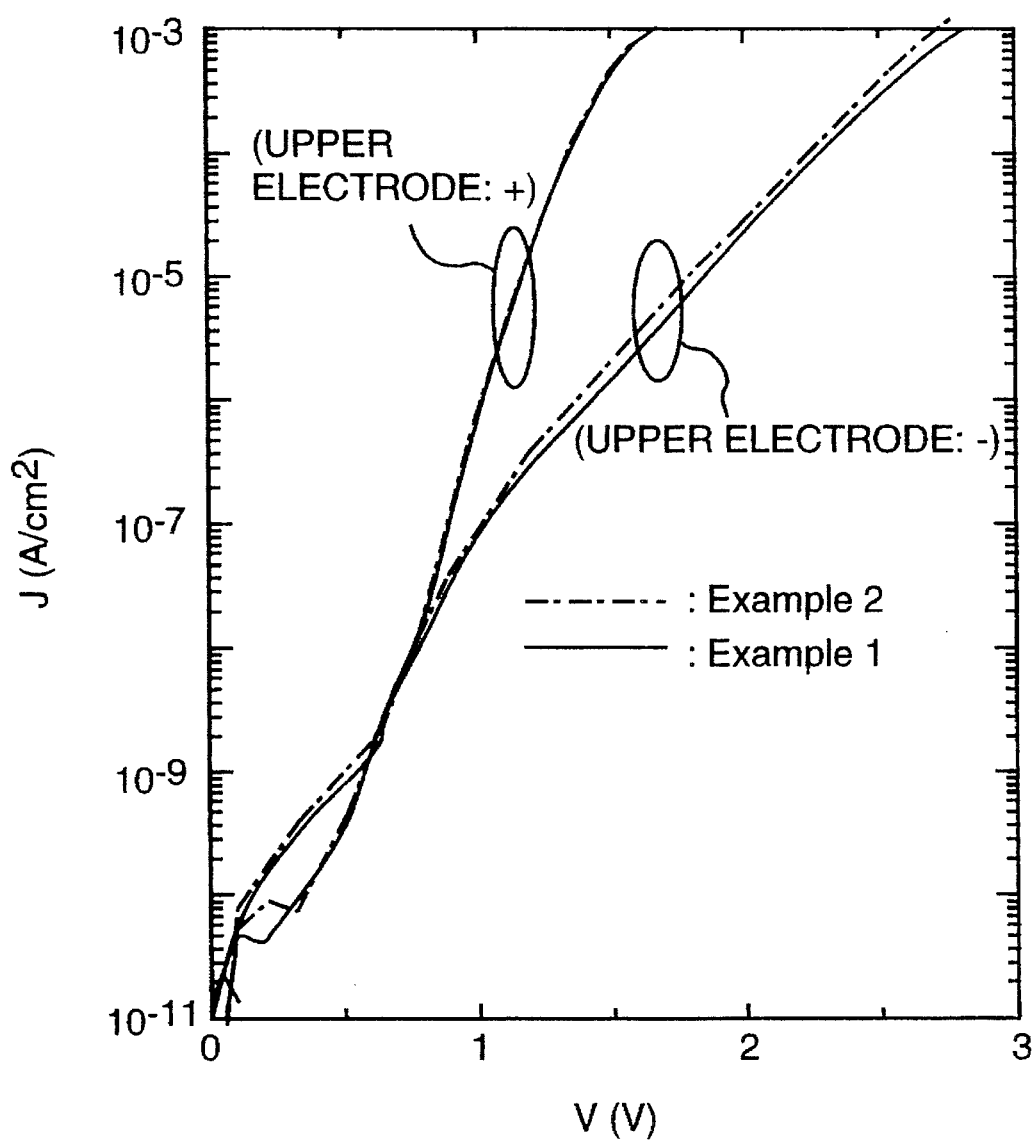
FIG. 9 is a view for explaining the effect of Example 2, and a graph showing the leakage current properties of a capacity element.

As seen from FIG. 9 which is a graph showing leakage current properties, a leakage current density J of the capacity element in Example 2 is about the same as a leakage current density J of the capacity element in Example 1. That is to say, the capacity element of this example has about the same leakage current properties that the capacity element of Example 1 has, and in addition, it has a larger capacity value than in Example 1.

Effect of the Invention:

As described above, according to a process for preparing a semiconductor device of the present invention, the capacity value of a capacity element of DRAM can be increased without deteriorating leakage current properties of the capacity element of DRAM. In addition, according to the present invention, a first insulating film constituting the surface of a capacity lower electrode is prevented from peeling in subsequent steps.

What is claimed is:

1. A process for manufacturing a capacity element on a semiconductor device comprises:
    a step of forming a capacity lower electrode having, on a surface of the semiconductor device, a first conductive film,
    a step of forming a capacity insulating film comprising a tantalum oxide film,
    a step of subjecting the tantalum oxide film to a densification treatment at a temperature in a range of from room temperature to 300° C., and
    a step of forming a capacity upper electrode comprising a second conductive film.

2. The process for manufacturing a semiconductor device according to claim 1 wherein the first conductive film comprises of film of tungsten, molybdenum or titanium; film of nitride or silicide of tungsten, molybdenum or titanium; or laminated structure of two or more of the above films.

3. The process for manufacturing a semiconductor device according to claim 1 wherein the formation of the tantalum oxide film is carried out by a chemical vapor deposition method using an organic tantalum material.

4. The process for manufacturing a semiconductor device according to claim 1 wherein the densification treatment for the tantalum oxide film is a plasma treatment using an oxidizing gas.

5. The process for manufacturing a semiconductor device according to claim 4 wherein-the oxidizing gas comprises at least one of an oxygen gas, an oxygen gas containing water and a nitrous oxide.

6. The process for manufacturing a semiconductor device according to claim 1 wherein the second conductive film comprises of film of tungsten, molybdenum or titanium; film of nitride or silicide of tungsten, molybdenum or titanium; or laminated structure of two or more of the above films.

7. A process for manufacturing a capacity element on a semiconductor device comprises
    a step of forming a silicon film pattern having its surface covered with hemispherical crystalline particles with a particle diameter in a range of from 20 to 200 nm,
    a step of forming, on the surface of the silicon film pattern, a first conductive film to form a capacity lower electrode, the conductive film thickness being less than 100 nm,
    a step of forming a capacity insulating film comprising a tantalum oxide film,
    a step of subjecting the tantalum oxide film to a densification treatment, and
    a step of forming a capacity upper electrode comprising a second conductive film.

* * * * *